United States Patent [19]
Bernier

[11] Patent Number: 6,049,096
[45] Date of Patent: Apr. 11, 2000

[54] PROTECTION COMPONENT FOR TELEPHONE LINE INTERFACE

[75] Inventor: Eric Bernier, Mettray, France

[73] Assignee: STMicroelectronics, S.A., Gentilly, France

[21] Appl. No.: 09/061,666

[22] Filed: Apr. 16, 1998

[30] Foreign Application Priority Data

Apr. 17, 1997 [FR] France ................................. 97 04982

[51] Int. Cl.⁷ .......................... H01L 29/74; H01L 31/111
[52] U.S. Cl. ........................... 257/173; 257/154; 257/174
[58] Field of Search .................................... 257/132, 154, 257/173, 174

[56] References Cited

U.S. PATENT DOCUMENTS 4,897,706  1/1990  Voss .
5,696,391  12/1997  Bernier ..................................... 257/146
5,828,089  10/1998  Bernier ..................................... 257/173

FOREIGN PATENT DOCUMENTS 0 687 051 A1  12/1995  European Pat. Off. .
0 785 577 A1  7/1997   European Pat. Off. .
48-73083      10/1973  Japan .

*Primary Examiner*—Ngân V. Ngô
*Attorney, Agent, or Firm*—Theodore E. Galanthay; Robert Iannucci; Seed IP Law Group

[57] ABSTRACT

The present invention relates to a component protecting against electric overloads likely to occur on a conductor in series with which is placed a detection resistor. The component includes a first cathode-gate thyristor and a second anode-gate thyristor, of the gate current or forward break-over type. The anode region of the first thyristor, formed on the lower surface side, is separate from the isolating wall surrounding the thyristor and the rear surface of the isolating wall is coated with a portion of an insulating layer.

14 Claims, 4 Drawing Sheets

PROTECTION COMPONENT FOR TELEPHONE LINE INTERFACE

BACKGROUND OF THE INVENTION

1. Field of the Invention

The present invention relates to a protection component, specifically, a protection component applicable to the protection of telephone circuits.

2. Discussion of the Related Art

European patent application EP-A-0687051, herein incorporated by reference, describes a protection circuit for interface of telephone lines and specific implementations of this circuit in the form of a monolithic component.

FIG. 1 of the present application reproduces FIG. 4 of this prior patent application and shows a circuit component including two head-to-tail thyristors Th1 and Th2, respectively a cathode-gate thyristor and an anode-gate thyristor connected between a line AB and a reference terminal G. The gates are connected together to a node or terminal B. A common terminal of the thyristors is connected to a node or terminal A, a resistor Rd being inserted between the nodes A and B. The other common terminal of the thyristors is connected to reference terminal G. A Zener diode Z1 connected between terminals B and G triggers, when it avalanches, thyristor Th1, and a Zener diode Z2 connected between terminals A and G triggers, when it avalanches, thyristor Th2. When the current between terminals A and B exceeds a determined threshold, one or the other of thyristors Th1 and Th2 is turned on by its gate.

Thus, in the circuit of FIG. 1, according to the involved biasing, one or the other of thyristors Th1 and Th2 turns on if the current through resistor Rd exceeds a determined threshold or if the voltage on line AB exceeds the avalanche voltage of diode Z1 or Z2.

FIG. 2 of the present application reproduces FIG. 7 of the above-mentioned patent application and shows an embodiment of the circuit of FIG. 1. The indication of the locations of components Th1, Th2, Z1, and Z2 of FIG. 1 has been included in FIG. 2.

However, in the practical implementation of the circuit, the applicant noticed that, although the triggering of thyristor Th1 after the starting of the avalanche of Zener diode Z1 does not raise any specific problem, the triggering sensitivity of thyristor Th2 after the passing of a current through resistor Rd should still be improved. More specifically, this triggering takes too long, having a duration longer than 1 μs. Efforts for optimizing the topology of the component (see FIGS. 8A and 8B of European patent application EP-A-068705) have yielded no results. When an overvoltage with a particularly steep edge (for example, a standardized 0.5/700 μs wave with a 30 A intensity) occurs on line AB, thyristor Th2 turns on only after a certain delay and, during this delay, the protection component lets through the peak intensity of 30 A, which can damage the integrated circuit to be protected.

To solve this problem and improve the reaction speed of the component after the occurrence of a positive overvoltage on line AB, the applicant has provided in European patent application EP-A-0785577 herein incorporated by reference a modification of the structure of the component of FIG. 2 and more specifically of the portion of this component corresponding to thyristor Th2, as is shown in FIG. 3.

FIG. 3 schematically shows an example of monolithic implementation of the circuit of FIG. 1. This component is realized as that of FIG. 2 from an N-type substrate. In the lefthand portion of the component, the same elements as those shown in the left-hand portion of FIG. 2 are designated by the same references.

A difference with respect to the circuit of FIG. 2 is that this assembly of semiconductive layers and regions is formed in a well isolated by P-type isolating walls 11 to isolate the thyristor Th1 and its associated components of thyristor Th2. These walls are formed by conventional and known techniques, including such steps performing a diffusion from the upper and lower surfaces of the substrate. Further, a region P8 of shortcircuit detection is not shown in FIG. 3, but this region can be provided if desired.

The left-hand portion of FIG. 3 includes, at the lower substrate surface, a P-type layer P2 and, at the upper substrate surface, P-type regions P1 and P7 in which are respectively formed N-type regions N1 and N7. At the interface between region P7 and a substrate N, an N-type region N4 is formed.

The lower surface of the wafer is coated with a metallization M2. Region P7 is coated with a metallization M3. Region N7 and a portion of region P1 are coated with a metallization M7. Region N1 is coated with a metallization M1-1 which corresponds to a portion of metallization M1 of FIG. 2.

This structure is an implementation of the assembly of thyristor Th1 and Zener diode Z1 of FIG. 1. Thyristor Th1 includes regions N1-P1-N-P2 and is associated with regions N7 and P7 to form a gate amplification thyristor. Zener diode Z1 is formed by the junction between regions P7 and N4 especially designed to assume this function.

The right-hand portion of FIG. 3 shows a realization of the elements corresponding to the assembly of thyristor Th2 and Zener diode Z2 of FIG. 1. Diode Z2 corresponds to one of the junctions of the thyristor which is a forward breakover thyristor. This structure may be formed in a well isolated by P-type isolating walls 12.

In this right-hand portion, the bottom surface is occupied by an N-type heavily-doped layer N11 formed by diffusion or implantation-diffusion. On the top surface, successively formed are a P-type deep diffusion P12; within region P12, an N-type deep diffusion N13; and, within region N13, separate regions P14 of type P and N15 of type N.

Thyristor Th2, from its anode to its cathode, corresponds to regions and layers P14-N13-P12-N-N11. Region N15 is an anode gate contacting region. Anode region P14 is coated with a metallization M1-2 connected to metallization M1-1. Anode gate contacting region N15 is coated with a metallization M4 corresponding to the metallization of same reference in FIG. 2 and connected to terminal B.

In this structure, when thyristor Th2 is forward biased, the junction most likely to avalanche is junction N13-P12. This junction must thus be optimized to have a desired avalanche threshold, preferably close to that of junction P7-N4. Because the regions P12 and M13 are formed by successive diffusions, it is possible to optimize the doping levels and the diffusion profiles so that this junction has the desired features.

Also, if thyristor Th2 is considered as formed of an assembly of a PNP transistor P14-N13-P12 and of an NPN transistor N13-P12-N-N11, the gains of these transistors can be optimized to increase the sensitivity of thyristor Th2.

The creation of such a component does not require any additional steps of manufacturing with respect to those necessary to make the component of FIG. 2 (noting that, although no isolating wall has been illustrated in the partial view of FIG. 2, in practice isolating walls will exist in the general structure to which the component of FIG. 2 belongs). More specifically, region P12 can be made at the same time as the upper portion of isolating walls 11 and 12, region N13 can be made at the same time as region N4, region P14 at the same time as regions PI and P7, and region N15 at the same time as regions N1, N7, and N11. However, although resulting from the same diffusion steps, that is, with a same duration and a same anneal temperature, these diffusions can have distinct doping levels. For instance, the doping level of region P12 will be much lower than that of the isolating walls.

As an example of numeric values, the following approximate values of dopant concentration Cs (in at./cm$^3$) and of junction depth xj (in $\mu$m) can be chosen for various regions:

|  | Cs | xj |
| --- | --- | --- |
| layer P14 | about 10$^{18}$ | 20 |
| layer N15 | about 10$^{20}$ | 10 |
| layer N13 | about 10$^{17}$ | 40 |
| layer P12 | about 10$^{16}$ | 90 |
| layer N11 | about 10$^{20}$ | 10 |

With the component of FIG. 3, thyristor Th2 starts conducting extremely rapidly after an overvoltage (less than 1 $\mu$s after the beginning of the overvoltage). Thus, the component of FIG. 3 satisfactorily solves most of the problems raised.

However, in the implementation of the component of FIG. 3, the applicant has noticed that in some configurations of ring signals, the component triggers undesiredly. The present invention aims at avoiding this drawback.

SUMMARY OF THE INVENTION

According to the principles of the present invention, there is provided a monolithic component of protection against electric overloads likely to occur on a conductor in series with which is placed a detection resistor. This component is formed in a substrate of a first type of conductivity having an upper surface and a lower surface and includes first and second upper surface metallizations for connection to the terminals of said resistor. It also includes a third lower surface metallization for connection to a reference potential. A first vertical cathode-gate thyristor is laterally isolated by an isolating wall of the second type of conductivity. The component also includes a second vertical anode-gate thyristor, of the gate current or forward break-over type. The first and second thyristors are formed head-to-tail between the first and third metallizations, the second metallizations corresponding to the gates of these thyristors. The anode region of the first thyristor, formed on the lower surface side, is separate from the isolating wall and the rear surface of the isolating wall is coated with a portion of an insulating layer.

According to an embodiment of the present invention, the component includes an avalanche diode between the second and third metallizations placed so that its avalanche causes the forward triggering of the first thyristor, the break-over voltage of the second thyristor being substantially equal to that of the avalanche voltage of the avalanche diode.

According to an embodiment of the present invention, the assembly of the first thyristor and of the avalanche diode includes a first layer of the second type of conductivity formed in the lower surface of the substrate and separate from the isolating wall. Also included are second and third regions of the second type of conductivity formed in the upper surface of the substrate and fourth and fifth regions of the first type of conductivity respectively formed in the second and third regions. Finally, a sixth region of the first type of conductivity is formed at the interface between the third region and the substrate.

A specific advantage of the present invention is that, at the cost of very small modifications to a preexisting component (modification of the mask of a P-type region and of the mask of rear surface isolating layers) the invention solves a problem where using the preexisting component was impossible in some operating conditions.

As will be discussed in detail hereafter, the applicant has noticed that the problem of the prior art especially arises when the impedance to which the ring signal is applied is low especially when the intensity of the output signal is relatively high while in negative phase. The present invention aids to solve this problem.

The foregoing objects, characteristics and advantages of the present invention will be discussed in detail in the following non-limiting description of specific embodiments, in connection with the accompanying drawings.

DETAILED DESCRIPTION

As usual in the field of the representation of semiconductor components, the cross-sectional views of components are neither drawn to scale horizontally, nor vertically. For the choice of the dimensions, those skilled in the art will refer to their usual knowledge and to the teachings of the above-mentioned patent application.

Figure 3:
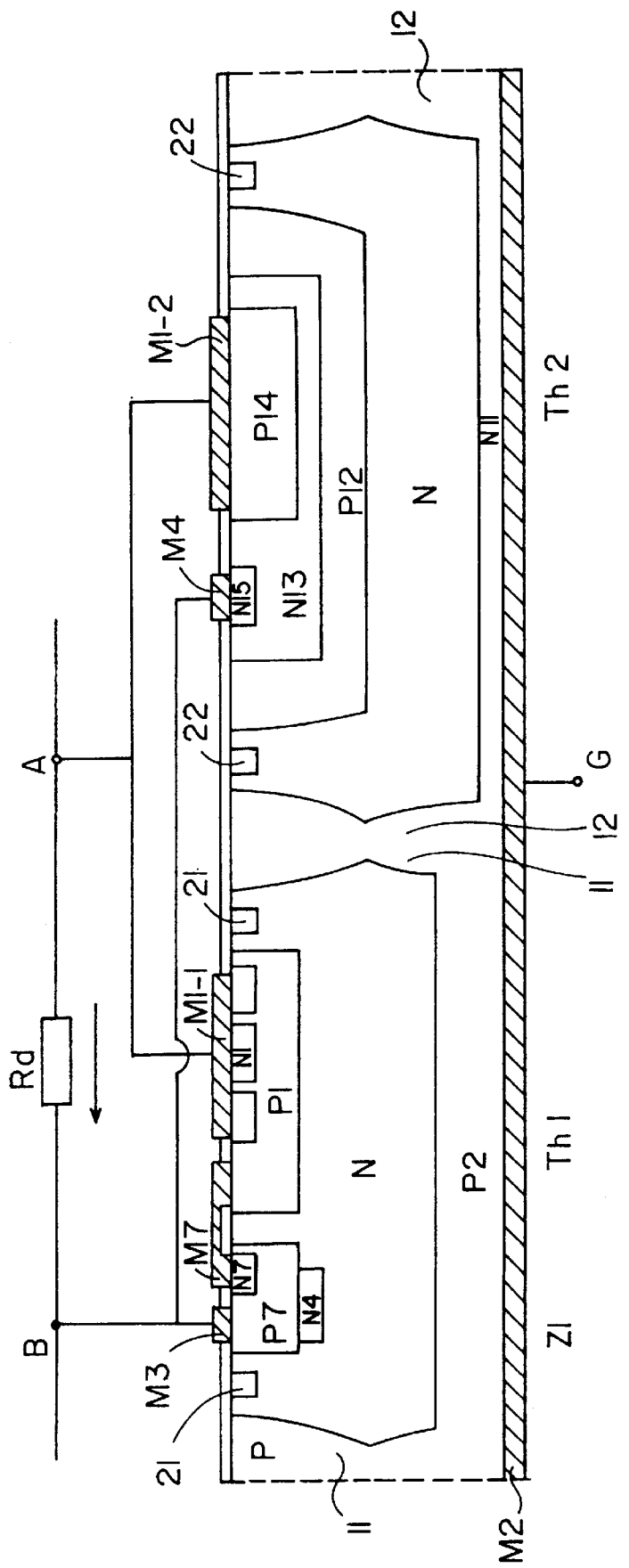
FIG. 3 corresponds to FIG. 3 of European patent application EP-A-0785577.

It has been previously indicated that the component of FIG. 3 could be triggered by a positive or negative overvoltage between terminals AB and terminal G, or by an excess current flowing through detection resistor Rd disposed between terminals A and B.

Figures 1, 2:
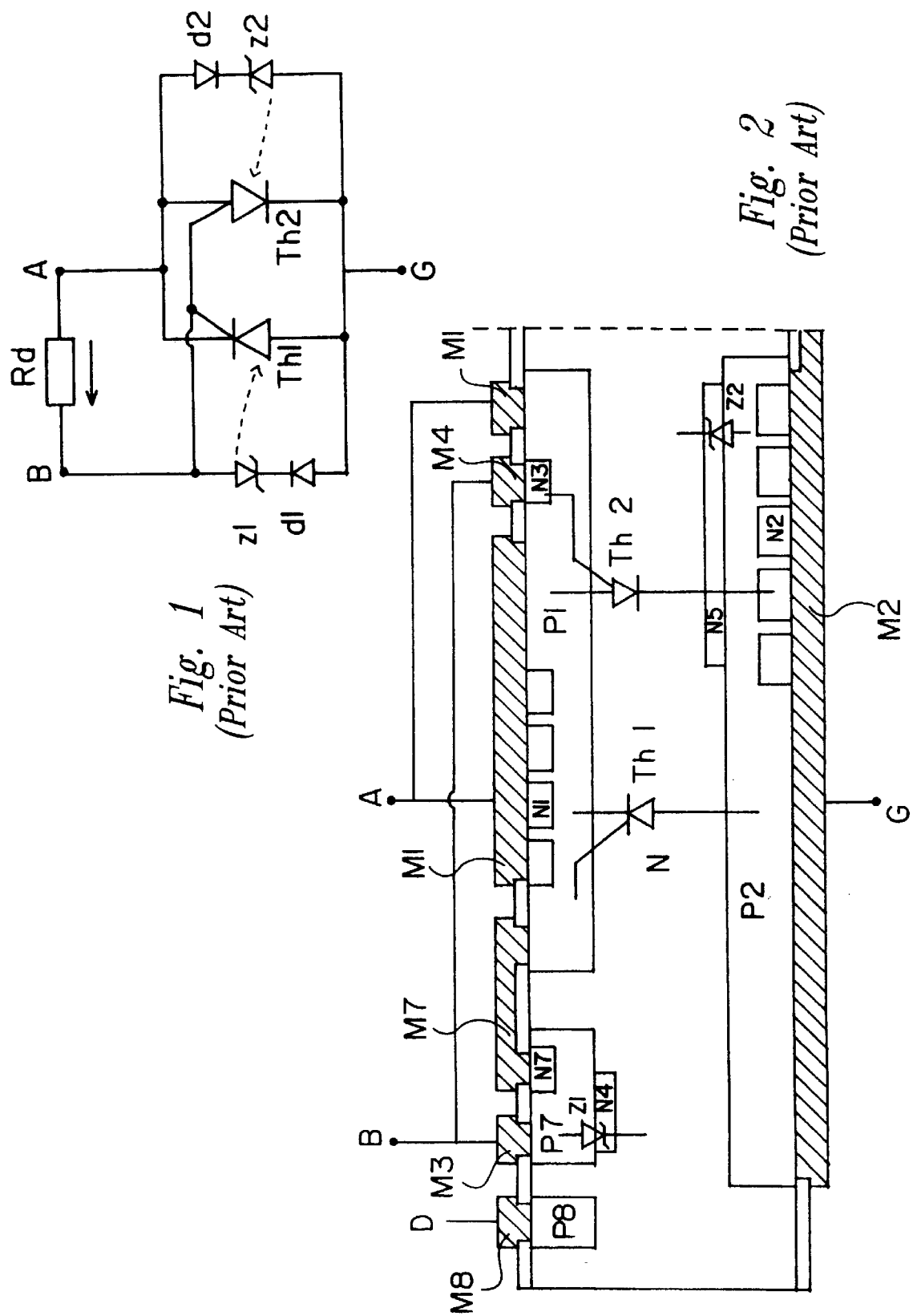
FIG. 1 corresponds to FIG. 4 of European patent application EP-A-0687051 and shows a circuit diagram of an embodiment of the invention.
FIG. 2 corresponds to FIG. 7 of European patent application EP-A-0687051.

The current triggering mode requires a more attentive examination. It can be seen, for example, in relation with FIG. 1. When a current flows from terminal A to terminal B, thyristor Th2 is likely to turn on if the voltage between terminal A (or B) and the ground is positive. This will be called the triggering mode or quadrant [I>0, V>0]. If the current flows from terminal B to terminal A, thyristor Th1 is likely to be conductive provided that the potential on terminals A and B is lower than the potential on terminal G. This will be called quadrant [I<0, V<0]. Actually, in the speech operating mode of the telephone network, these are the two only quadrants in which it is possible for an overload to occur and where it is useful to have a protection. It should be noted that the circuit cannot normally trigger in quadrant [I>0, V<0] since, in this case, thyristor Th1 is biased in the right direction but the gate current is not in a direction likely to trigger the thyristor. Similarly, in mode [V>0, I<0], the device does not normally trigger since thyristor Th2 is biased in the right direction but the gate current is not in the direction likely to trigger the thyristor.

However, the inventor has found in practice that the circuit is likely to trigger while the telephone system is in the ring mode. More detailed studies have shown that this triggering occurs in quadrant [I>0, V<0], that is, thyristor Th1 turns on while, normally, its gate current flows in the wrong direction. The present invention aims at avoiding this parasitic triggering. In quadrant [I>0, V<0], the ring signal is negative. In this ease, the ringing, which generally corresponds to an a.c. voltage on the order of 130 peak volts, is superposed on a d.c. voltage which can reach −72 volts. This results in the presence of a maximum peak voltage of over −200 volts. In some telephone circuits, during the ringing phase, the impedance is reduced and peak currents on the order of 400 milliamperes may be reached. Thus, in the diagram of FIG. 3, a current flows in resistor Rd from A to B while terminals A and B are negative with respect to terminal G but the voltage (−200 volts) is insufficient to cause a voltage breakdown of thyristor Th1 (P2-N-P1-N1). During this phase, terminal G is positive with respect to terminal B. No gate current can thus flow through thyristor Th1. However, the thyristor triggers.

Figure 4B:
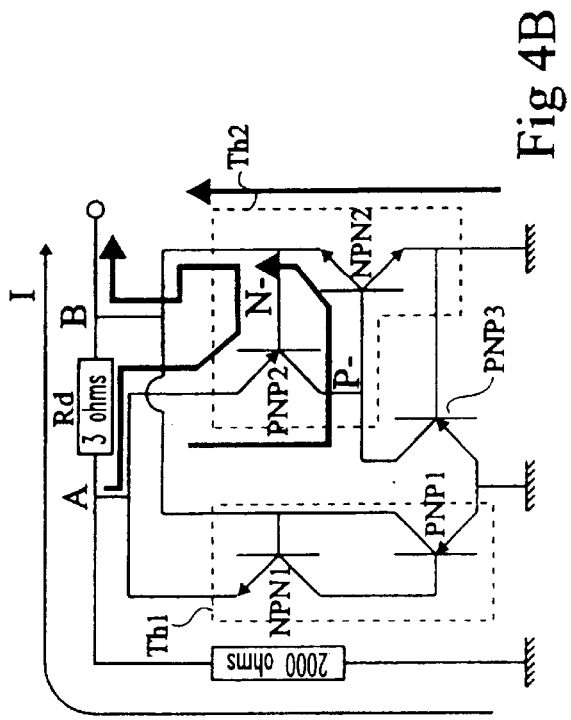
FIGS. 4A through 4D show equivalent circuit diagrams of the component of FIG. 3 and illustrate the current flow in various operating phases.
Figure 4C:
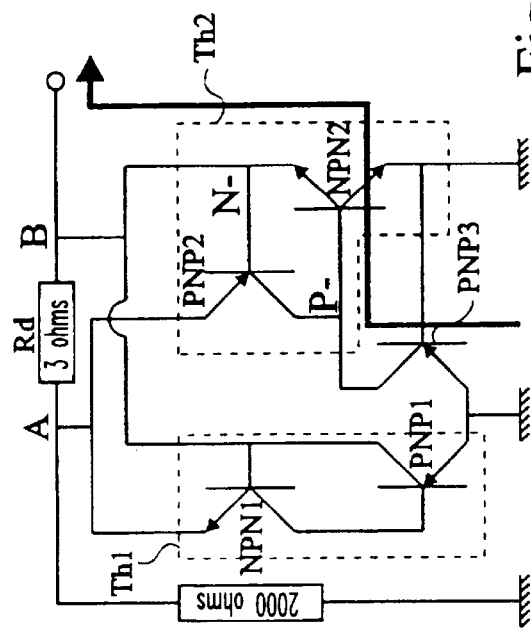
Figure 4A:
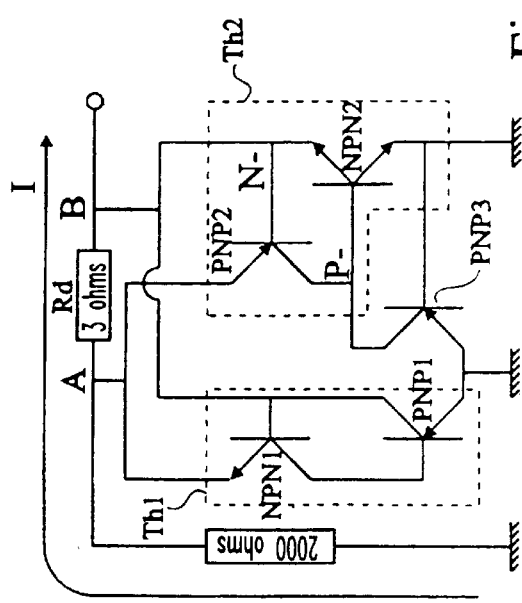

To analyze this triggering, the applicant has drawn an equivalent diagram of the circuit of FIG. 3, as shown in FIG. 4A. In this equivalent diagram, thyristor Th1 is conventionally represented as the association of two transistors NPN1 and PNP1. Thyristor Th2 is represented as the association of two transistors PNP2 and NPN2. Further, the applicant has shown in this diagram a parasitic component, which has revealed to play a fundamental part in the considered phenomenon. This parasitic component is a PNP-type transistor, PNP3, the emitter of which corresponds to isolating wall 11–12, the base of which corresponds to substrate N, and the collector of which corresponds to region P12 of thyristor Th2. To explain the parasitic phenomenon, FIGS. 4B to 4D illustrate successive steps of triggering of the components of FIG. 4A.

In a first phase, illustrated in FIG. 4B, a current will flow between a base and emitter of transistor PNP2 as soon as the voltage drop between terminals A and B exceeds 0.6 volts. This turns on transistor PNP2 which turns on transistor NPN2 and thus causes the flowing of a current from terminal G to terminal B.

In a second phase, illustrated in FIG. 4C, the turning on of transistor NPN2 turns on parasitic transistor PNP3. Thus, referring to FIG. 3, a current will flow from metallization M2 to metallization M4 via a parasitic thyristor including regions P2, N, P12, N13, and N15.

Figure 4D:
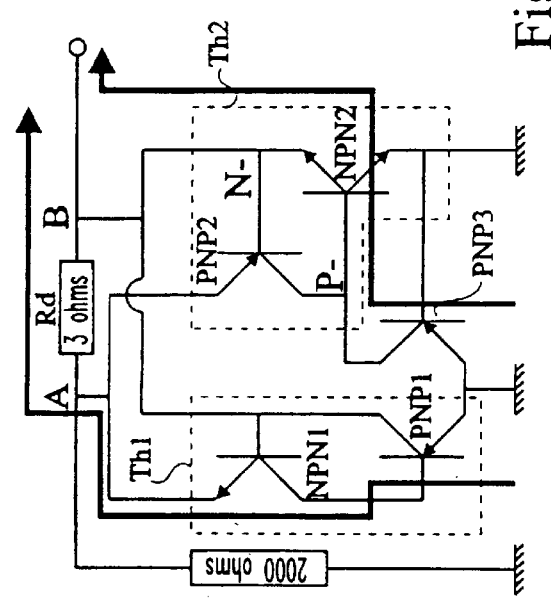

In a last phase, illustrated in FIG. 4D, due to the conduction of this parasitic thyristor, P-type regions P2, 11, and 12 start injecting holes, that is, the emitter of transistor PNP1 starts injecting at the same time as the emitter of transistor PNP3 and this turns on thyristor Th1. This is the parasitic effect observed by the applicant.

To avoid this disadvantage, the applicant has attempted to modify the circuit in which the component of FIG. 3 is incorporated. For this purpose, the applicant has first considered reducing the value of resistance Rd to avoid the starting of the process, that is, the turning-on of transistor PNP2. However, this solution causes other drawbacks, i.e., a triggering with a sufficiently low threshold can no longer be ensured in the normal current triggering modes of thyristors Th1 and Th2.

Figure 5:
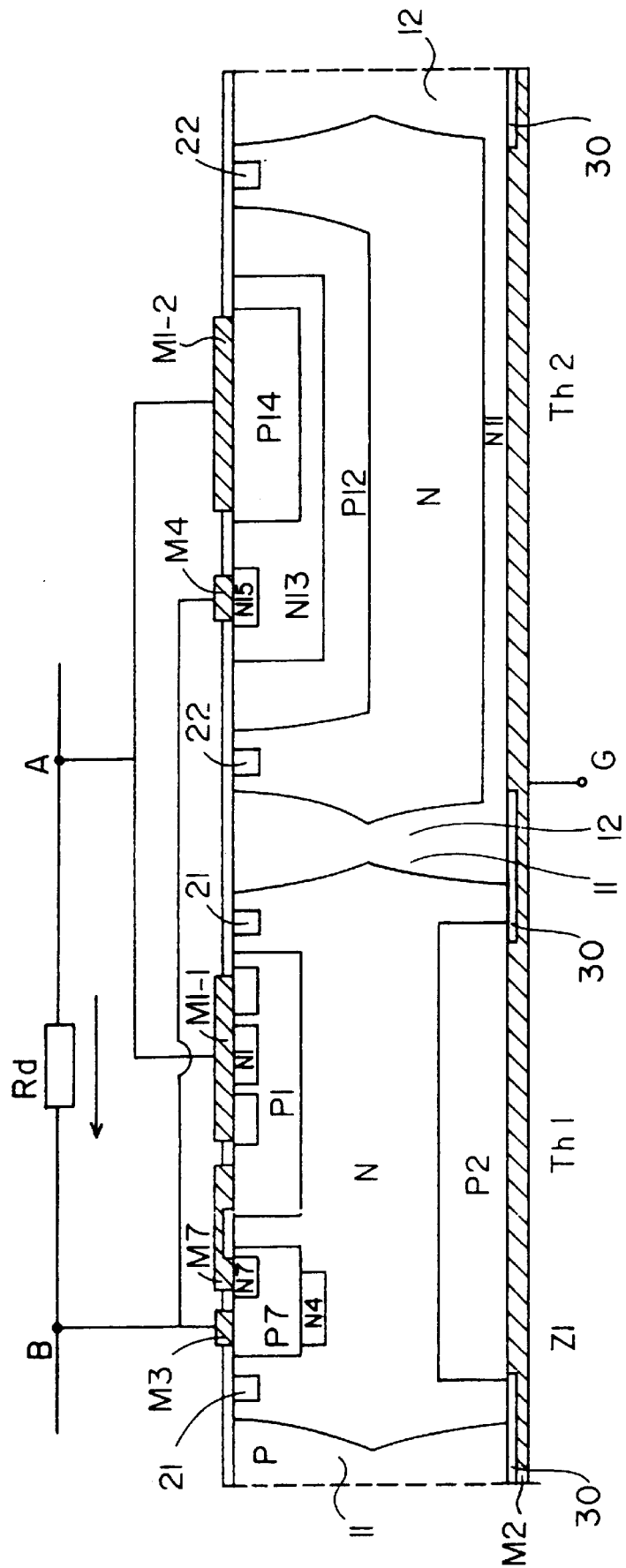
FIG. 5 shows an embodiment of the component according to the present invention.

Accordingly, the applicant provides the solution shown in FIG. 5. FIG. 5 contains similar components as those of FIG. 3, and, in the interest of brevity the same reference numbers are used for similar components. One difference between FIG. 5 and FIG. 3 is that region P2, instead of extending continuously to the periphery of isolating wall 11, is separate from isolating wall 11. Further, insulating layers 30 are formed on the rear surface before metallization M2 under isolating walls 11, 12. The abovementioned parasitic thyristor formed of isolating wall 11, substrate N, region P12 and regions N13–N15 can no longer turn on and cause thyristor Th1 to turn on.

Further, to avoid possible parasitic triggerings, stopchannel rings are provided at the upper internal periphery of each of walls 11 and preferably at the upper periphery of walls 12 as well. These stop-channel rings are respectively designated by references 21 and 22. They avoid triggerings of parasitic MOS transistors due to the presence of a voltage on metallizations running over the upper surface. For example, in FIG. 5, the line connecting metallizations M3 and M4 is in fact a metallization which runs over a silicon oxide which is above the area included between region P1 and isolating wall 11. If this metallization is at a negative potential with respect to the rear surface metallization, there is a risk of turning on a P-channel MOS transistor (P11-N-P1) and of running current through the gate of thyristor P2-N-P1-N1 to trigger it at a lower voltage than that desired, defined by Zener diode N4–P7. The stop-channel rings avoid this drawback.

Of course, the present invention is likely to have various alterations, modifications, and improvements which will readily occur to those skilled in the art. Especially, various usual structures, such as emitter short-circuit areas, can be realized conventionally by those skilled in the art. Like in the case of patent application EP-A-0687051, the described structure may only form a portion of a general component including for example two symmetrical structures similar to those of FIG. 5. Concerning the emitter short-circuit distributions and densities in regions N1 and N11, reference could be made to the teachings of aforementioned and previously incorporated European patent application EP-A-0687051.

By analogy with the description of a prior component, the case where thyristor Th1 is a gate amplification thyristor has been described in detail. Of course, the present invention also advantageously applies to the case of a simple thyristor. In this case, terminal B is directly connected to metallization M7 and regions N4, P7, and N7 are absent.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

I claim:

1. A monolithic component of protection against electric overloads likely to occur on a conductor in series with which is placed a detection resistor, this component being formed in a substrate of a first conductivity type having an upper surface and a lower surface and including:

first and second upper surface metallizations for connection to the terminals of said resistor and a third lower surface metallization for connection to a reference potential;

a first vertical cathode-gate thyristor laterally isolated by an isolating wall of the second conductivity type;

a second vertical anode-gate thyristor, of the gate current or forward break-over type, the first and second thyristors being formed head-to-tail between the first and third metallizations, the second metallizations corresponding to the gates of these thyristors; and wherein the anode region of the first thyristor, formed on the lower surface side, is separate from the isolating wall and the rear surface of the isolating wall is coated with a portion of isolating layer.

2. The monolithic protection component of claim 1, further including an avalanche diode coupled between the second and third metallizations and placed so that its avalanche causes the forward triggering of the first thyristor, the break-over voltage of the second thyristor being substantially equal to the avalanche voltage of the avalanche diode.

3. The monolithic protection component of claim 2 wherein the assembly of the first thyristor and of the avalanche diode includes:

a first layer of the second conductivity type formed in the lower surface of the substrate and separate from the isolating wall;

second and third regions of the second type of conductivity formed in the upper surface of the substrate;

fourth and fifth regions of the first type of conductivity respectively formed in the second and third regions; and a sixth region of the first type of conductivity formed at the interface between the third region and the substrate.

4. In an integrated circuit, a protection circuit in series with a detection resistor, the protection circuit comprising:

a substrate having a first conductivity type and having first and second surfaces;

a patterned first metal layer partially covering the first surface of the substrate, the first metal layer for coupling the protection circuit to the detection resistor;

a second metal layer covering a portion of the second surface of the substrate, the second metal layer separated from regions of the second surface of the substrate by a plurality of regions of an insulation layer;

a first vertical thyristor coupled to the first metal layer at a first end and coupled to the second metal layer and at least one of the regions of the insulation layer at a second end; and a second vertical thyristor coupled to the first metal layer at a first end and coupled to the second metal layer and at least one of the regions of the insulation layer at a second end.

5. The protection circuit of claim 4 wherein the first and second vertical thyristors are separated from one another by an isolation wall formed from a dopant of a second conductivity type.

6. The protection circuit of claim 4, further including:

an avalanche diode formed in the substrate and coupled to the first thyristor, the diode set to cause a triggering of the first thyristor when the diode avalanches.

7. The protection circuit of claim 6, further including a second avalanche diode formed in the substrate and coupled to the second thyristor, the second diode set to cause a triggering of the second thyristor when the second diode avalanches.

8. The protection circuit of claim 4 wherein the first thyristor consists of a first doped area of the first conductivity type at the first surface of the substrate coupled to a first doped area of a second conductivity type coupled to a second doped area of the first conductivity type coupled to a second doped area of the second conductivity type which is coupled to the second metal layer.

9. The protection circuit of claim 8 wherein the second transistor consists of a third doped area of the first conductivity type at the first surface of the substrate coupled to a third doped area of the second conductivity type coupled to a fourth doped area of the first conductivity type coupled to a fourth doped area of the second conductivity type which is coupled to the second metal layer.

10. A protection circuit in a semiconductor device comprising:

a substrate including one or more doped areas at a first surface and having a second surface;

a plurality of isolation regions within the substrate and coupled to the first surface, each isolation region extending toward the second surface;

a metal layer coupled to the second surface; and a plurality of insulator regions, each coupled between the metal layer and the second surface, at least one of the insulator regions coupled to a respective one of the isolation regions, at least one insulator region separating one of the respective isolation regions from the metal layer.

11. The protection circuit of claim 10, further including a first thyristor coupled between the first and second metal layers.

12. The protection circuit of claim 11, further including a second thyristor coupled between the first and second metal layers, the second thyristor separated from the first thyristor by one of the isolation regions.

13. The protection circuit of claim 11, further including an avalanche diode coupled so as to cause the first thyristor to turn on at a specified voltage.

14. The protection circuit of claim 12, further including a second avalanche diode coupled so as to cause the second thyristor to turn on at a specified voltage.

* * * * *